United States Patent
Dasani

(10) Patent No.: US 9,236,140 B2
(45) Date of Patent: Jan. 12, 2016

(54) COMPLEMENTARY READ-ONLY MEMORY (ROM) CELL AND METHOD FOR MANUFACTURING THE SAME

(71) Applicant: STMicroelectronics International N.V., Amsterdam (NL)

(72) Inventor: Jitendra Dasani, Greater Noida (IN)

(73) Assignee: STMICROELECTRONICS INTERNATIONAL N.V., Amsterdam (NL)

( * ) Notice: Subject to any disclaimer, the term of this patent is extended or adjusted under 35 U.S.C. 154(b) by 302 days.

(21) Appl. No.: 14/014,224

(22) Filed: Aug. 29, 2013

(65) Prior Publication Data

US 2014/0003121 A1  Jan. 2, 2014

Related U.S. Application Data

(62) Division of application No. 13/168,609, filed on Jun. 24, 2011, now Pat. No. 8,526,209.

(30) Foreign Application Priority Data

Dec. 28, 2010  (IN) .......................... 3125/DEL/2010

(51) Int. Cl.
*G11C 17/00* (2006.01)
*G11C 17/08* (2006.01)
*H01L 27/112* (2006.01)
*G11C 7/06* (2006.01)
*G11C 17/12* (2006.01)

(52) U.S. Cl.
CPC .............. *G11C 17/08* (2013.01); *G11C 7/065* (2013.01); *G11C 17/12* (2013.01); *H01L 27/11226* (2013.01)

(58) Field of Classification Search
CPC ...................................................... G11C 17/00
USPC .................................................. 365/94–105
See application file for complete search history.

(56) References Cited

U.S. PATENT DOCUMENTS

| | | | | |
|---|---|---|---|---|
| 4,037,217 A | * | 7/1977 | Savarese | ........................ 365/104 |
| 4,241,417 A | * | 12/1980 | Pauly | ............................... 714/54 |
| 5,602,788 A | | 2/1997 | Barry et al. | |
| 2008/0008019 A1 | | 1/2008 | Balasuramanian | |

* cited by examiner

*Primary Examiner* — Harry W Byrne
(74) *Attorney, Agent, or Firm* — Allen, Dyer, Doppelt, Milbrath & Gilchrist, P.A.

(57) ABSTRACT

A complementary read-only memory (ROM) cell includes a transistor; and a bit line and a complementary bit line adjacent to the transistor; wherein a drain terminal of the transistor is connected to one of the bit line and the complementary bit line based on data programmed in the ROM cell.

3 Claims, 6 Drawing Sheets

COMPLEMENTARY READ-ONLY MEMORY (ROM) CELL AND METHOD FOR MANUFACTURING THE SAME

RELATED APPLICATION

The present invention is a divisional of U.S. patent application Ser. No. 13/168,609 filed Jun. 24, 2011, which claims the benefit of priority of India Application No. 3125/DEL/2010 filed Dec. 28, 2010, both of which are incorporated herein by reference in their entireties.

FIELD OF INVENTION

The present invention broadly relates to a complementary read-only memory (ROM) cell and method for manufacturing the same.

SUMMARY OF THE INVENTION

According to the present invention, a complementary read-only memory (ROM) cell comprises a transistor; and a bit line and a complementary bit line disposed adjacent the transistor; wherein a drain terminal of the transistor is configured to be connected to one of the bit line and the complementary bit line based on data programmed in the ROM cell.

BACKGROUND

Read-only memory (ROM) has been widely used in computers and electronic devices. In standard ROM (also known as mask ROM), data is physically encoded in the circuit, thus it is usually programmed once during fabrication e.g. at the foundry.

FIG. 1a shows a schematic circuit diagram illustrating example standard ROM cells. FIG. 1b shows a schematic circuit diagram illustrating conventional connections to a sense amplifier. A conventional ROM cell uses a single transistor for storing an information bit by having a single data line discharging or non-discharging depending on the data on accessing the ROM cell. Typically, as standard ROM cells do not include complementary bit lines, the sense amplifier has one end connected to a bit line (BL) and another end connected to a reference node with fixed voltage VDD (equal to the pre-charge level of the BL). The sense amplifier is set unbalanced in favour of the reference node to differentiate between a "0" data (Rd0) and a "1" data (Rd1). The unbalance in the differential sense amplifier may be created through various means. For example, in the sense amplifier shown in FIG. 1b the unbalance is created by the sizes of Transistors M1 and M2, e.g. Transistor M2 has a greater width than Transistor M1 [M2(W)>M1(W)].

Thus, in the conventional ROM cell, the single data line needs to discharge more to overcome the offset of the unbalanced sense amplifier for Rd0, thus compromising the ability to achieve a high speed. Also, in case of a supply bump or dip, the effect directly influences the reference node, but not the BL as at the time of evaluation its pre-charge is Off (the BL is not connected to the supply). This can lead to a wrong decision from the sense amplifier. Further, the unbalanced sense amplifier has a large a variation of offset with respect to voltage.

There have been some attempts at overcoming the above problems. One proposed approach discloses a complementary ROM cell with two transistors per bit. In this approach, the two transistors storing complementary logic states form a memory cell and store a data bit, as shown in FIG. 2a. One transistor has a source terminal connected to a ground terminal while the other transistor has a source terminal left unconnected, representing e.g. a "0" data. This arrangement is reversed for a "1" data. The drain terminal of each of the two transistors is connected to a corresponding one of a differential bit-line pair which provides a differential signal representing the stored data bit to a sense amplifier.

However, in this approach, the ROM core area is about twice the area than that of the conventional ROM cell, as determined by active to active distance of the device. Also, the width of the single transistor is still the same with 100% area overhead, thus there is substantially no gain in the BL discharge rate.

Another proposed approach discloses a ROM cell having localized reference bit lines, as shown in FIG. 2b. In this approach, a reference bit line refBL is input to one side of a differential sense amplifier while a selected data bit line, BL0 or BL1, is input to the other side. The reference bit line refBL is pre-charged and includes two columns 202, 204; the first column 202 includes devices, e.g. 206, that are matched to memory cell devices wherein a device of the selected word line, e.g. WL0, WL1, will be selected to discharge the reference bit line refBL. The second column 204 includes a recessed oxide device, e.g. 208, corresponding to each memory cell in the column.

As the capacitance of the reference line in this approach is about twice that of a conventional bit line, the discharge rate using such reference line is about half of that using the normal bit line. Thus, the effective differential current is only about half of the actual current. In addition, in the Rd0 case, the two transistors are both ON using this approach. Due to statistical variation, their difference is typically very small, thus becoming a constraint for high-speed operation.

A need therefore exists to provide a complementary ROM cell and method for manufacturing the same that seek to address at least one of the above problems.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

Figure 1A:
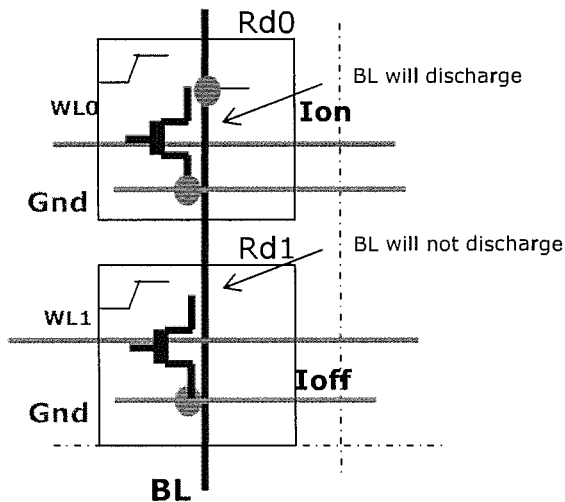
FIG. 1a shows a schematic circuit diagram illustrating example standard ROM cells.
Figure 1B:
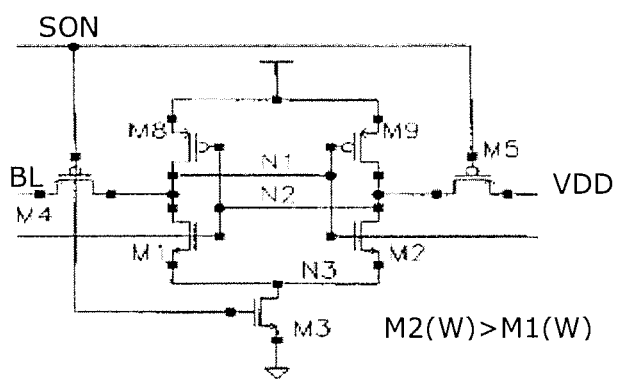
FIG. 1b shows a schematic circuit diagram illustrating conventional connections to a sense amplifier.

According to a first aspect of an example embodiment, there is provided a complementary read-only memory (ROM) cell, comprising:
a transistor; and
a bit line and a complementary bit line disposed over the transistor;
wherein a drain terminal of the transistor is configured to be connected to one of the bit line and the complementary bit line based on data programmed in the ROM cell.

The drain terminal may be configured to be connected to the bit line when the data programmed is 0.

The drain terminal may be configured to be connected to the complementary bit line when the data programmed is 1.

The drain terminal may be configured to be connected to either the bit line or the complementary bit line through a via.

The transistor may further comprise a gate terminal configured to be connected to a respective word line.

The transistor may further comprise a source terminal configured to be connected to a ground.

According to a second aspect of an example embodiment, there is provided a ROM unit comprising an array of complementary ROM cells, each complementary ROM cell comprising:
a transistor; and
a bit line and a complementary bit line disposed adjacent the transistor;
wherein a drain terminal of the transistor is configured to be connected to one of the bit line and the complementary bit line based on data programmed in the ROM cell.

The array of complementary ROM cells may comprise a plurality of ROM cells each configured to be connected to a respective word line and a pair of bit line and complementary bit line.

The complementary ROM cells having the same word line bit may be configured to be connected to the respective pair of bit line and complementary bit line.

According to a third aspect of an example embodiment, there is provided a control board of an electronic product, comprising:
a processor; and
a plurality of complementary ROM cells configured to be coupled to the processor, each complementary ROM cell comprising:
a transistor; and
a bit line and a complementary bit line disposed adjacent the transistor;
wherein a drain terminal of the transistor is configured to be connected to one of the bit line and the complementary bit line based on data programmed in the ROM cell.

According to a fourth aspect of an example embodiment, there is provided a motherboard of a personal computer, comprising:
a processor; and
a plurality of complementary ROM cells configured to be coupled to the processor, each complementary ROM cell comprising:
a transistor; and
a bit line and a complementary bit line disposed adjacent the transistor;
wherein a drain terminal of the transistor is configured to be connected to one of the bit line and the complementary bit line based on data programmed in the ROM cell.

According to a fifth aspect of an example embodiment, there is provided a method for manufacturing a complementary read-only memory (ROM) cell, the method comprising:
providing a transistor;
disposing a bit line and a complementary bit line over the transistor; and
connecting a drain terminal of the transistor to one of the bit line and the complementary bit line based on data programmed in the ROM cell.

Figure 3:
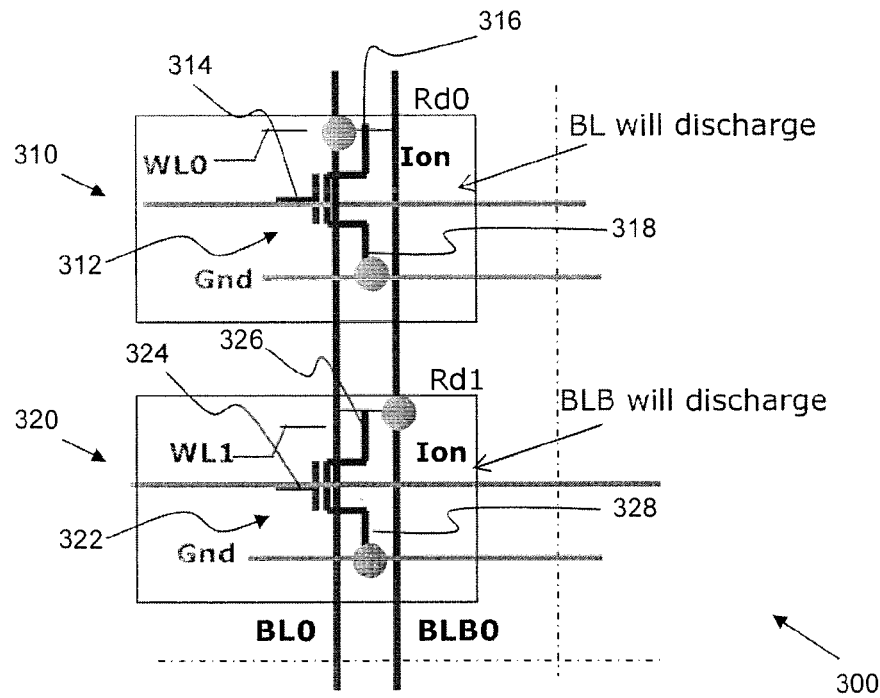
FIG. 3 shows a schematic circuit diagram illustrating two complementary ROM cells according to an example embodiment.

FIG. 3 shows a schematic circuit diagram 300 illustrating two complementary ROM cells 310, 320 according to an example embodiment. Each of ROM cells 310, 320 comprises a respective transistor 312, 322 (for example, N-type metal-oxide-semiconductor (NMOS) transistors) disposed adjacent a pair of bit lines BL0, BLB0 (BLB0 being a complementary bit line). In one example embodiment, the bit lines BL0, BLB0 help to create a complementary signal for reading the respective ROM cells 310, 320, as described in detail below.

As can be seen from FIG. 3, transistors 312, 322 each comprises a gate terminal 314, 324 connected to a respective word line WL0, WL1, and a source terminal 318, 328 connected to the ground Gnd. Further, transistors 312, 322 each comprises a respective drain terminal 316, 326 connected to either the bit line BL0 or the complementary bit line BLB0. That is, ROM programming is done on the drain side. In one example embodiment, the connection between the drain terminal 316, 326 to the bit line BL0 or BLB0 is formed during fabrication e.g. by appropriate positioning of a respective via.

In one example embodiment, VIA programming is done on either BL0 or BLB0 depending on the data to be stored, i.e. 0 or 1. For example, in FIG. 3, the ROM cell 310 is programmed to store a "0" data (shown as Rd0). Here, the drain terminal 316 of ROM cell 310 is connected to the bit line BL0 such that the bit line BL0 discharges an ON current $I_{on}$ corresponding to the "0" data.

On the other hand, the ROM cell 320 is programmed to store a "1" data (shown as Rd1). Here, the drain terminal 326 of ROM cell 320 is connected to the complementary bit line BLB0 such that the bit line BLB0 discharges an ON current $I_{on}$ corresponding to the "1" data.

In the ROM cells 310, 320 as shown in FIG. 3, the cell pitch is effectively determined by the two data lines which are in the metal layer and the presence of the VIA for 2 consecutive adjacent '0' data stored (e.g. bit lines BL0 and BLB0), and is thus significantly less than the two active pitch distance disclosed in prior art approaches. The active transistor width can also be increased as long as it is not substantially larger than the cell pitch. Thus, a high ON current and low mismatch can be achieved in the transistors 312, 322, resulting in robust and high-speed ROM with the smaller area compared to prior art approaches.

Figure 4:
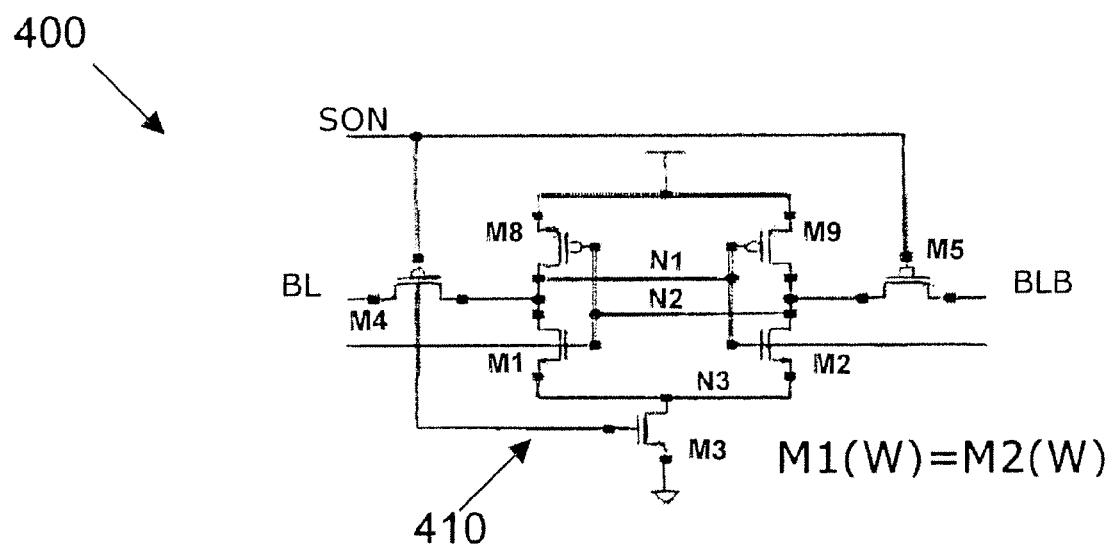
FIG. 4 shows a schematic circuit diagram illustrating connections to a sense amplifier according to an example embodiment.

Also, the ROM cell design shown in FIG. 3 enables use of balanced sensing with substantially zero nominal offset, which needs a lower differential input voltage for decision making, as compared to prior art approaches. FIG. 4 shows a schematic circuit diagram 400 illustrating connections to a sense amplifier 410 according to an example embodiment. As shown in FIG. 4, one end of the sense amplifier 410 is connected to bit line BL while the other end is now connected to the complementary bit line BLB. Thus, the sense amplifier 410 is substantially balanced and M1(W)=M2(W). In one embodiment, the pre-charge voltages of bit lines BL and BLB are equalized after each operation such that any minimal differential between the bit lines created by accessing any memory cell indicates a corresponding data (0 or 1), resulting in a high-speed operation of the ROM cell.

Figure 5:
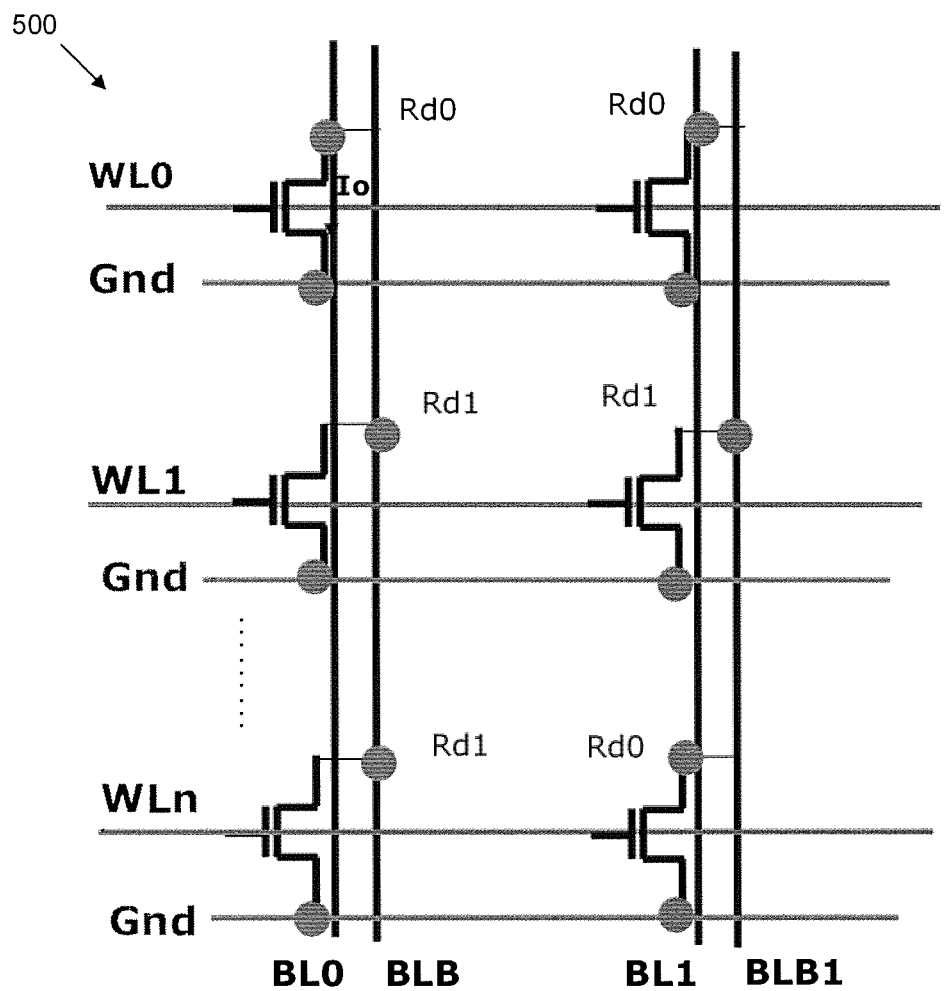
FIG. 5 shows a schematic circuit diagram illustrating an array of complementary ROM cells similar to the cells in FIG. 3.

FIG. 5 shows a schematic circuit diagram 500 illustrating an array of complementary ROM cells similar to the ROM cells 310, 320 in FIG. 3. In FIG. 5, two pairs of complementary bit lines (BL0 and BLB0, BL1 and BLB1) and a plurality of word lines WL0, WL1 ... WLn are shown. However, it will be appreciated that a ROM device can have a plurality of such pairs. As shown in FIG. 5, some of the ROM cells are programmed to store "1" data while others are programmed to store "0" data, as described above with respect to FIG. 3. Also, ROM cells having the same word line bit (i.e. connected to different word lines but belong to the same column as shown in FIG. 5) are connected to the same pair of bit lines, e.g. BL0 and BLB0, BL1 and BLB1.

Figure 6:
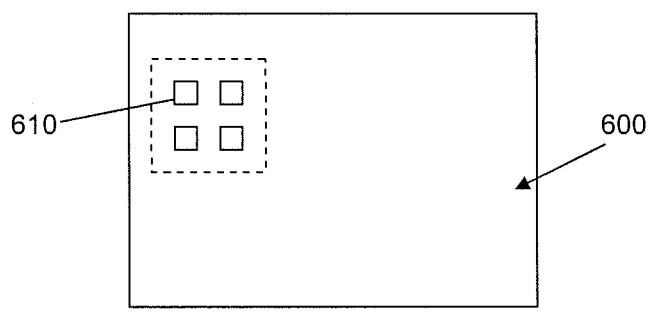
FIG. 6 shows a block diagram illustrating an end-device using the complementary ROM cells according to an example embodiment.

FIG. 6 shows a block diagram illustrating an end-device 600 using the complementary ROM cells 610 according to an example embodiment. Such end-device 600 may be in the form of a motherboard of a personal computer, or a control board of an electronic product, e.g. a media player, a set-top box, etc. Here, the complementary ROM cells 610 may be coupled to a processor, a power source, other memory devices, etc. (not shown), as will be understood by a person skilled in the art. Typically, the complementary ROM cells 610 are used for start-up functions, also known as booting up, of the personal computer/electronic product.

Figure 2A:
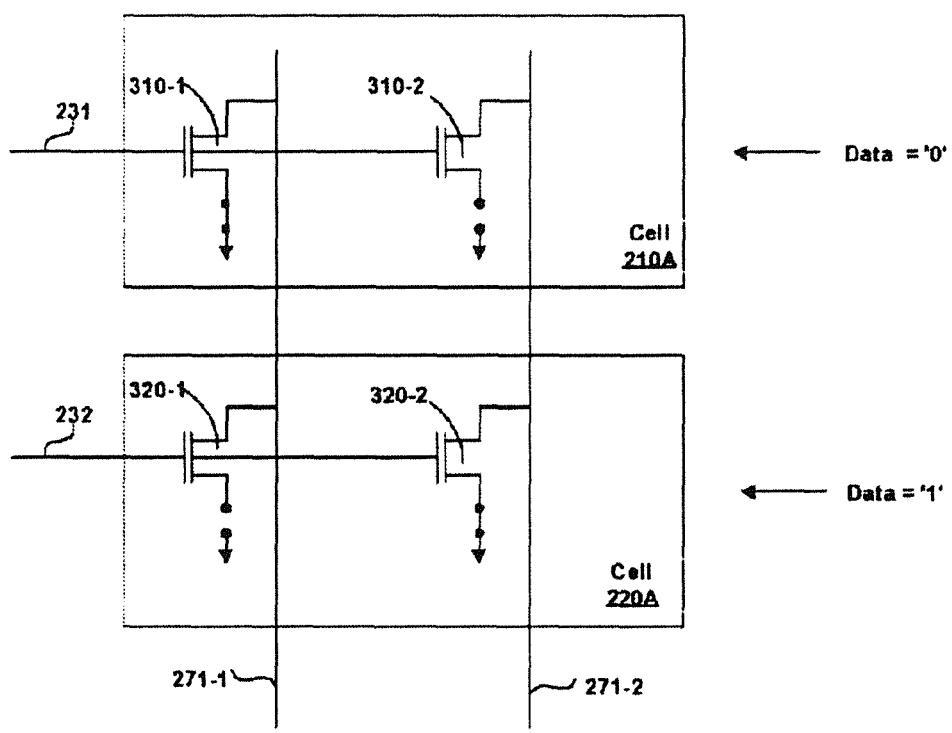
FIG. 2a shows a schematic circuit diagram illustrating existing complementary ROM cells according to one prior art approach.
Figure 2B:
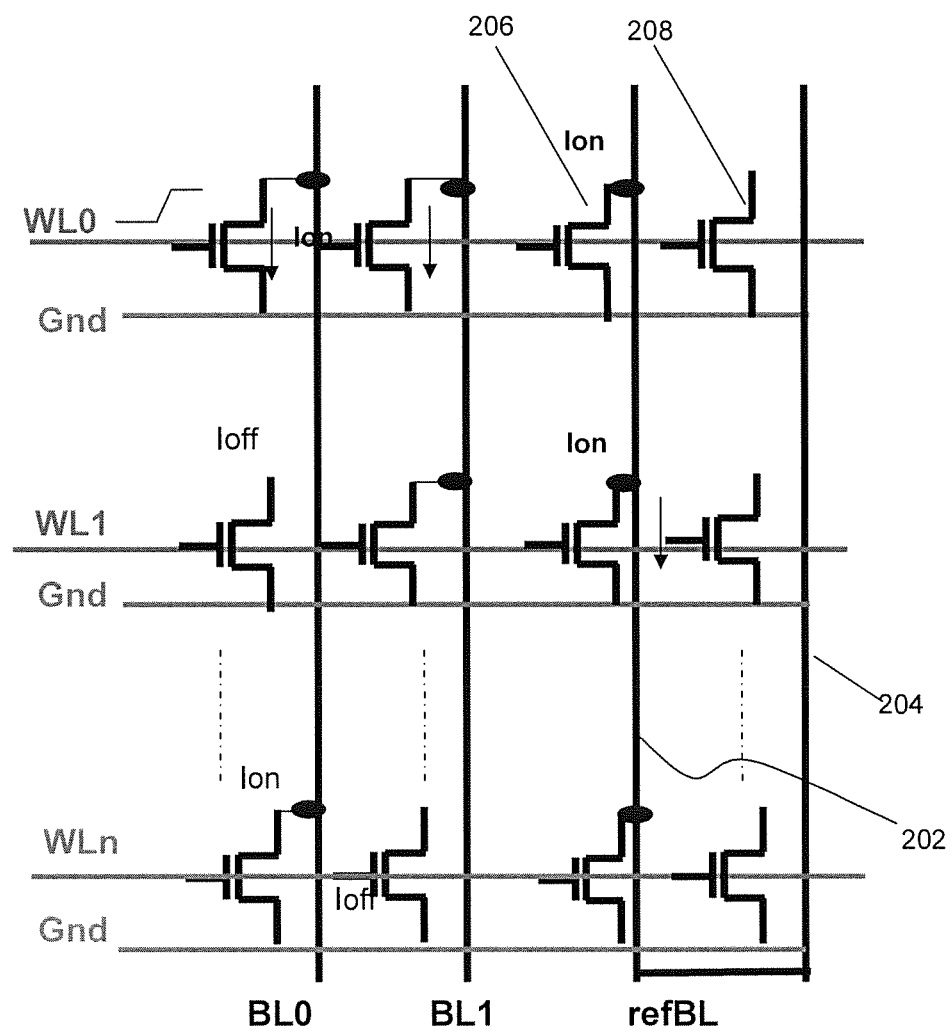
FIG. 2b shows a schematic circuit diagram illustrating existing ROM cells according to another prior art approach.

The inventor has evaluated the performance of the ROM cells described in the example embodiments, using e.g. recent complementary metal oxide semiconductor (CMOS) technology. It has been found that the ROM cells of the example embodiments may provide about 40% reduction in BL discharge time with increased robustness and lower design complexity, and similar area (~5% more), as compared to standard ROM cells. In addition, the ROM cells of the example embodiments may also provide about 30% reduction in BL discharge time on top of a 28% area reduction, as compared to the prior art complementary ROM design shown in FIG. 2.

Figure 7:
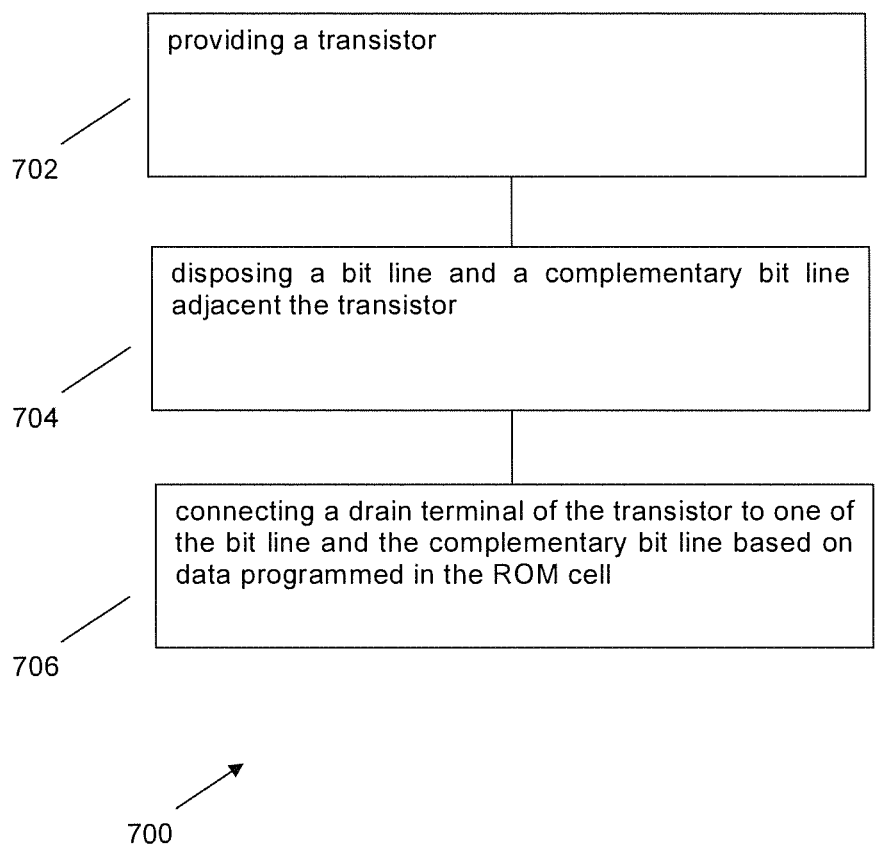
FIG. 7 shows a flow chart illustrating a method for manufacturing a complementary ROM cell according to an example embodiment.

FIG. 7 shows a flow chart 700 illustrating a method for manufacturing a complementary ROM cell according to an example embodiment. At step 702, a transistor is provided. At step 704, a bit line and a complementary bit line are disposed adjacent the transistor. At step 706, a drain terminal of the transistor is connected to one of the bit line and the complementary bit line based on data programmed in the ROM cell.

While this detailed description has set forth some embodiments of the present invention, the appended claims cover other embodiments of the present invention which differ from the described embodiments according to various modifications and improvements. For example, other forms of connection between the drain terminal and the bit lines, instead of vias, may be used. The programming of "0" and "1" may also be reversed.

Within the appended claims, unless the specific term "means for" or "step for" is used within a given claim, it is not intended that the claim be interpreted under 35 U.S.C. 112, paragraph 6.

The invention claimed is:

1. A ROM unit comprising an array of complementary ROM cells, each complementary ROM cell comprising:
   a transistor; and
   a bit line and a complementary bit line disposed adjacent the transistor;
   wherein a drain terminal of the transistor is configured to be connected to one of the bit line and the complementary bit line based on data programmed in the ROM cell.

2. The ROM unit as claimed in claim 1, wherein the array of ROM cells comprises a plurality of complementary ROM cells each configured to be connected to a respective word line and a pair of bit line and complementary bit line.

3. The ROM unit as claimed in claim 2, wherein the complementary ROM cells having the same word line bit are configured to be connected to the respective pair of bit line and complementary bit line.

* * * * *